US00RE41013E

(19) United States
(12) Reissued Patent
Tsai et al.

(10) Patent Number: US RE41,013 E
(45) Date of Reissued Patent: Nov. 24, 2009

(54) METHOD OF AND APPARATUS FOR PROVIDING LOOK AHEAD COLUMN REDUNDANCY ACCESS WITHIN A MEMORY

(76) Inventors: Terry T. Tsai, 1521 Meadow Glen Way., Hacienda Heights, CA (US) 91745; Daniel F. McLaughlin, 1514 Windsor Woods Blvd, Fort Wayne, IN (US) 46845

(21) Appl. No.: 11/140,527

(22) Filed: May 27, 2005

Related U.S. Patent Documents

Reissue of:
(64) Patent No.: 6,571,348
Issued: May 27, 2003
Appl. No.: 09/357,698
Filed: Jul. 20, 1999

U.S. Applications:
(60) Provisional application No. 60/128,039, filed on Apr. 6, 1999.

(51) Int. Cl.
*G06F 11/00* (2006.01)

(52) U.S. Cl. ..... 714/6; 711/133
(58) Field of Classification Search ..... 714/6, 714/7, 8, 25
See application file for complete search history.

(56) References Cited

U.S. PATENT DOCUMENTS 4,885,720 A 12/1989 Miller et al.
5,153,880 A 10/1992 Owen et al.
5,197,030 A 3/1993 Akaogi et al.
5,381,370 A 1/1995 Lacey et al.
5,469,401 A 11/1995 Gillingham
5,699,306 A 12/1997 Lee et al.
5,732,030 A 3/1998 Dorney
5,815,453 A 9/1998 Matsui
5,845,315 A 12/1998 Cutter
5,889,727 A 3/1999 Hsu et al.
5,930,194 A 7/1999 Yamagata et al.
6,011,734 A 1/2000 Pappert
6,084,806 A 7/2000 Sugibayashi

*Primary Examiner*—Nadeem Iqbal

(57) ABSTRACT

A look ahead column redundancy circuit provides high speed memory access to both regular memory arrays and redundant memory arrays. In the preferred embodiment of the present invention, the information on both the address bus and the information on the next address bus are decoded by redundant column decoders in parallel. The decoded information from the redundant column decoders is then provided to a redundancy column pathway as the addressing information from the address bus and the next address bus is provided to a main column pathway. The information on the address bus is latched when beginning at a new column address. The information on the next address bus is latched for the next column address when operating in a burst cycle mode. The main column pathway preferably includes a latch, a main column decoder and a main column select circuit. A disable signal is also activated by the redundant column decoders if the addressing information for a current memory access operation corresponds to an address within the redundant memory array. When activated, the disable signal disables the main column select circuit within the main column pathway. If the addressing information for a current memory access operation does not correspond to an address within the redundant memory array, then the memory access operation is performed within the main memory array without any delays. Since the decoding is performed before the information is latched onto the column address bus, the proper pathway is selected without the need for any additional delay.

65 Claims, 3 Drawing Sheets

METHOD OF AND APPARATUS FOR PROVIDING LOOK AHEAD COLUMN REDUNDANCY ACCESS WITHIN A MEMORY

Matter enclosed in heavy brackets [ ] appears in the original patent but forms no part of this reissue specification; matter printed in italics indicates the additions made by reissue.

RELATED APPLICATIONS:

This application claims priority under 35 U.S.C. §119(e) of the co-pending U.S. provisional application Ser. No. 60/128,039 filed on Apr. 6, 1999 and entitled "METHOD OF AND APPARATUS FOR PROVIDING LOOK AHEAD COLUMN REDUNDANCY ACCESS WITHIN A MEMORY." The provisional application Ser. No. 60/128,039 filed on Apr. 6, 1999 and entitled "METHOD OF AND APPARATUS FOR PROVIDING LOOK AHEAD COLUMN REDUNDANCY ACCESS WITHIN A MEMORY" is also hereby incorporated by reference.

FIELD OF THE INVENTION

The present invention generally relates to semiconductor memory devices. More particularly, the present invention relates to redundancy circuits within semiconductor memory devices.

BACKGROUND OF THE INVENTION

Random access memory (RAM) is a component used within electronic systems to store data for use by other components within the system. Dynamic RAM (DRAM) is a type of RAM which uses a capacitor-type storage and requires periodic refreshing in order to maintain the data stored within the DRAM. Static RAM (SRAM) is another type of RAM which retains the information stored within the SRAM as long as power is applied. SRAM does not require periodic refreshing in order to maintain the stored data. Synchronous DRAM (SDRAM) operates within a synchronous memory system such that input and output signals are synchronized to an active edge of a system clock.

RAM is generally organized within the system into addressable blocks, each containing a predetermined number of memory cells. Each memory cell within a RAM represents a bit of information. The memory cells are organized into rows and columns. Each row of memory cells forms a word. Each memory cell within a row is coupled to the same wordline which is used to activate the memory cells within the row. The memory cells within each column of a block of memory are also each coupled to a pair of bitlines. These bitlines are also coupled to local input/output (LIO) lines. These local input/output lines are used to read data from an activated memory array or write data to an activated memory array. The pair of bitlines includes a bitline and an inverse bitline. A memory cell is therefore accessed by activating the appropriate wordline and pair of bitlines.

An address bus and next address bus are used to access specified memory cells within a memory array. The information on the address bus or next address bus is latched onto the wordline and bitline used for accessing data within the memory array. The next address bus is used when operating in a burst cycle mode to transfer large blocks of data. Addressing information is split into row and column address information which is decoded by individual row and address decoders to decrease access time. Burst cycle mode is used to transfer large blocks of data. Typically, in a burst cycle mode the memory array is divided into even and odd blocks with the address bus used to access the even block and the next address bus used to access the odd block. The next address is typically generated by automatically incrementing the address from the address bus. In this way, data may be transferred more rapidly.

Memory circuits are fabricated on wafers. Wafer yield is defined as the ratio of non-defective chips to the number of total chips fabricated on a given wafer. In general, as integration density in semiconductor memory devices increases, the likelihood of defective cells in any one memory array also increases. Therefore, the higher the integration density of chips fabricated on a given wafer, the lower the wafer yield.

It has been determined that an effective method for increasing wafer yield is to use redundant memory to replace defective memory. Redundant memory includes redundant memory cells which are configured in rows and/or columns and are used to replace rows and/or columns of the main memory array which are found to have one or more defective memory cells.

One problem which exists with the use of redundant memory circuits as substitutes for main memory circuits is access time. The column address is typically provided simultaneously to both a regular column address decoder and a redundant column address decoder. The redundant column address decoder is programmed with the addresses of defective columns. The redundant column address decoder decodes the column address and determines if the column address is programmed within the redundant memory array. If the column address corresponds to an address programmed into the redundant column address decoder, then the redundant column address decoder disables the regular column address decoder and initiates access to the redundant memory array. Otherwise, if the column address is not included within the redundant memory array, then the regular column address decoder is not disabled and the memory access is performed in the main memory array. The regular column address decoder must wait for the output of the redundant column address decoder to be valid before proceeding with the memory access. This waiting causes delays and extends the time necessary for each memory access operation.

A block diagram of a conventional redundancy address decoding circuit which requires a delay in the decoding scheme is illustrated in FIG. 1. Initially, either the information on the address bus 10 or the information on the next address bus 20 is latched by a latch 30 onto the column address bus 40. The information on the address bus 10 is latched by the latch 30 when beginning at a new column address. When the column address enable signal (CAEN) 15 is activated to a logical high voltage level, the information on the address bus 10 is passed through the transistor 13 and latched by the latch 30 onto the column address bus 40. The information on the next address bus 20 is latched by the latch 30 onto the column address bus 40 for the next address in a burst cycle mode. When the next address in a burst cycle is needed, the column address counter signal (CACTR) 25 is activated to a logical high voltage level, enabling the next address information from the next address bus 20 to be passed through the transistor 12 and latched by the latch 30 onto the column address bus 40.

The information latched by the latch 30 onto the column address bus 40 is provided as an input to both a regular column decoder 50 and a redundant column decoder 60. The regular column decoder 50 and the redundant column decoder 60 are arranged in parallel to decode the address information on the column address bus 40. If the redundant column decoder 60 detects an address within a corresponding redundant column memory array 100, then the redundant column decoder 60 sends a disabling signal to the regular column decoder 50 which disables the regular column pathway. If the redundant column decoder 60 detects an address within the redundant column memory array 100, then the redundant column decoder 60 also provides the decoded redundancy address information to a redundancy column select circuit 90. The redundancy column select circuit 90 then provides this information to circuitry (not shown) to complete the memory access operation, either read or write, within the redundancy column memory array 100. If the redundancy column decoder 60 does not decode an address within the redundancy column array 100, then the regular column pathway is not disabled and the regular column decoder 50 then provides the decoded address information to a regular column select circuit 80. The regular column select circuit 80 then provides this information to circuitry (not shown) to complete the memory access operation, either read or write, within the corresponding regular column memory array 110.

Accordingly, in such a configuration, in order to ensure that the regular column pathway is properly disabled when the column address is within the redundant memory array 100, the output from the regular column decoder 50 is delayed until the disable output 70 from the redundant column decoder 60 is valid. This delay is included within each memory access operation. One previous method for resolving this delay was to load both regular and redundant column activate information and data onto both the regular local I/O signal lines and the redundant local I/O signal lines and then select the appropriate local I/O signal lines using the disable output of the redundant column decoder.

A block diagram of a prior art technique for avoiding delay during memory access operations is illustrated in FIG. 2. Initially, either the information on the address bus 200 or the information on the next address bus 210 is latched by a latch 230 onto the column address bus 240. The information on the address bus 200 is latched by the latch 230 when beginning at a new column address. The column address enable signal (CAEN) 216 is activated to a logical high voltage level, enabling the information on the address bus 200 to pass through the transistor 212 and to be latched by the latch 230 onto the column address bus 240. The information on the next address bus 210 is latched by the latch 230 for the next address in a burst cycle mode. When the next address in a burst cycle is needed, the column address counter signal (CACTR) 225 is activated to a logical high voltage level, enabling the next address information from the next address bus 210 to pass through the transistor 213 to the latch 230. The next address information is then latched by the latch 230 onto the column address bus 240.

A regular column decoder 250 and a redundant column decoder 260 are arranged in parallel to decode the address information on the column address bus 240. The regular column decoder 250 is coupled to a regular column address select circuit 280 and the redundant column decoder is coupled to a redundant column address select circuit 290. The regular column decoder outputs the regular column address corresponding to the current addressing information to the regular column address select circuit 280 which instructs drivers (not shown) to perform the memory access operation within the regular memory array 300 utilizing the local I/O signal lines 310. If the redundant column decoder 260 detects an address within the redundant column memory array 320, then the redundant column decoder 260 outputs the decoded redundancy address information to the redundancy column address select circuit 290 which instructs memory drivers (not shown) to perform the memory access operation within the redundancy column memory array 320 utilizing the redundant local I/O signal lines 325. Both the local I/O signal lines 310 and the redundant local I/O signal lines 325 are coupled to a multiplexer 330. The local I/O signal lines 310 are coupled to an input A of the multiplexer 330, while the redundant local I/O signal lines 325 are coupled to an input B of the multiplexer 330. The signal REDUN 350 is output from the redundant column decoder 260 and provided as the control input to the multiplexer 330, to control which of the I/O signal lines 310 or the redundant local I/O signal lines 325 are selected by the multiplexer 330. If the redundant column decoder 260 detects an address within the redundancy column array 320, the REDUN signal 350 is raised to a logical high voltage level by the redundant column decoder 260 and the data on the redundancy local I/O signal lines 325 at the input B to is selected by the multiplexer 330. Otherwise, if the redundant column decoder 260 does not detect an address within the redundancy column array 320, the signal REDUN is pulled to a logical low voltage level and the data on the local I/O signal lines 310 at the input A is selected by the multiplexer 330. This solution will speed up access time during memory access operations but requires significant additional layout at the cost of additional space and complexity. What is needed is an improved circuit for decoding a column address and controlling access to regular and redundancy column memory cells.

SUMMARY OF THE INVENTION

A look ahead column redundancy circuit provides high speed memory access to both regular memory arrays and redundant memory arrays. In the preferred embodiment of the present invention, the information on both the address bus and the information on the next address bus are decoded by redundant column decoders in parallel. The decoded information from the redundant column decoders is then provided to a redundancy column pathway as the addressing information from the address bus and the next address bus is provided to a main column pathway through a latch. The information on the address bus is latched when beginning at a new column address. The information on the next address bus is latched for the next column address when operating in a burst cycle mode. The main column pathway preferably includes a main column decoder and a main column select circuit. A disable signal is also activated by the redundant column decoders if the addressing information for a current memory access operation corresponds to an address within the redundant memory array. When activated, the disable signal disables the main column select circuit within the main column pathway. If the addressing information for a current memory access operation does not correspond to an address within the redundant memory array, then the memory access operation is performed within the main memory array within any additional delays. Since the decoding is performed before the information is latched onto the column address bus, the proper pathway is selected without the need for any additional delay.

In one aspect of the present invention, an apparatus for accessing a memory structure including a main memory array and a redundant memory array comprises an address bus for carrying addressing information for a current memory access operation, a main column pathway including a main column decoder for decoding addressing information and a main select circuit for selecting appropriate groups of memory cells within the main memory array for a current memory access operation and a redundant column pathway including a redundant column decoder for decoding addressing information and a redundant select circuit for selecting appropriate groups of memory cells within the redundant memory array for a current memory access operation if the current memory access operation is accessing memory cells within the redundant memory array, wherein the redundant column pathway is selected if the current memory access operation is accessing memory cells within the redundant memory array. The redundant column decoder disables the main select circuit if the current memory access operation is accessing memory cells within the redundant memory array. The redundant column decoder is provided the addressing information before the main column pathway. The main column pathway is provided the addressing information and the redundant select circuit is provided decoded redundant addressing information from the redundant column decoder in response to a control signal. The groups of memory cells are columns.

In another aspect of the present invention, a method of completing memory access operations within a memory structure including a main memory array and a redundant memory array, comprises the steps of determining from addressing information for a current memory access operation if the addressing information represents an address included within the redundant memory array, decoding a redundant address within the redundant memory array, if the addressing information represents an address included within the redundant memory array, providing the addressing information for the current memory access operation to a main column pathway and providing the redundant address to a redundant column pathway in response to a first control signal, decoding a main address within the main memory array corresponding to the addressing information; activating a group of main memory cells within the main memory array corresponding to the main address and selecting the redundant column pathway if the addressing information represents an address included within the redundant memory array. The method further includes the step of disabling the step of activating a group of main memory cells, if the addressing information represents an address included within the redundant memory array. The method further includes the step of activating a group of redundant memory cells within the redundant memory array, if the addressing information represents an address included within the redundant memory array. The step of decoding a redundant address is completed before the step of providing the addressing information. The groups of main memory cells are columns within the main memory array. The groups of redundant memory cells are columns within the redundant memory array.

In yet another aspect of the present invention, an apparatus for controlling access to a memory structure including a regular memory array and a redundancy memory array comprises an address bus for carrying addressing information for a current memory access operation, a first redundancy column decoder coupled to the address bus for decoding the addressing information, the first redundancy column decoder including a first output for providing a first decoded redundancy address and a second output for providing a disable signal, a first pass through circuit coupled to the address bus for passing through the addressing information in response to a first control signal, a first latching circuit coupled to the first pass through circuit for latching the addressing information which has passed through the first pass through circuit, a regular column decoder circuit coupled to the first latching circuit for decoding the addressing information and providing a decoded regular address, a second pass through circuit coupled to the first output of the first redundancy column decoder for passing through the first decoded redundancy address in response to the first control signal, a second latching circuit coupled to the second pass through circuit for latching the first decoded redundancy address from the first output of the first redundancy column decoder which has passed through the second pass through circuit, a regular column select circuit coupled to the regular column decoder to receive the decoded regular address and to select a corresponding regular column address within the regular memory array, wherein the regular column select circuit is also coupled to receive the disable signal from the second output of the first redundancy column decoder for disabling the regular column select circuit if the addressing information corresponds to an address within the redundancy memory array and a redundancy column select circuit coupled to the second latching circuit to receive the first decoded redundancy address and to select a corresponding redundant column address within the redundancy memory array, if the addressing information corresponds to an address within the redundancy memory array. The first redundancy column decoder is provided the addressing information before the first latching circuit. The first control signal is a column address enable signal. The apparatus further includes a next address bus for carrying next addressing information for a next memory access operation, a second redundancy column decoder coupled to the next address bus for decoding the next addressing information, the second redundancy column decoder including a third output for providing a second decoded redundancy address and a fourth output for providing the disable signal, a third pass through circuit coupled to the next address bus for passing through the next addressing information in response to a second control signal, wherein the third pass through circuit is also coupled to pass the next addressing information through to the first latching circuit and a fourth pass through circuit coupled to the third output of the second redundancy column decoder for passing through the second decoded redundancy address in response to the second control signal, wherein the fourth pass through circuit is also coupled to pass the second decoded redundancy address through to the second latching circuit. The first and second column decoders are provided the addressing information and the next addressing information before the first latching circuit. The second control signal is a column address counter signal.

DETAILED DESCRIPTION OF THE PREFERRED EMBODIMENT

A look-ahead column redundancy circuit of the present invention includes a main memory pathway and a redundancy pathway in order to minimize memory access time and delays during memory access operations. Addressing information from an address bus and a next address bus is provided to a pair of redundant column decoders. The redundant column decoders decode the addressing information and determine if the addressing information corresponds to an address within the redundant memory array. The decoded information from the redundant column decoders is then provided to a redundancy column pathway as the addressing information from the address bus and the next address bus is provided to a main column pathway. The main column pathway includes a latching circuit, a main column decoder and a main column select circuit. A disabling signal is activated by the redundant column decoders if the addressing information for the current memory access operation corresponds to an address within the redundant memory array. When activated, the disabling signal disables the main column select circuit within the main column pathway and prevents the memory access operation to the main memory array.

Figure 1:
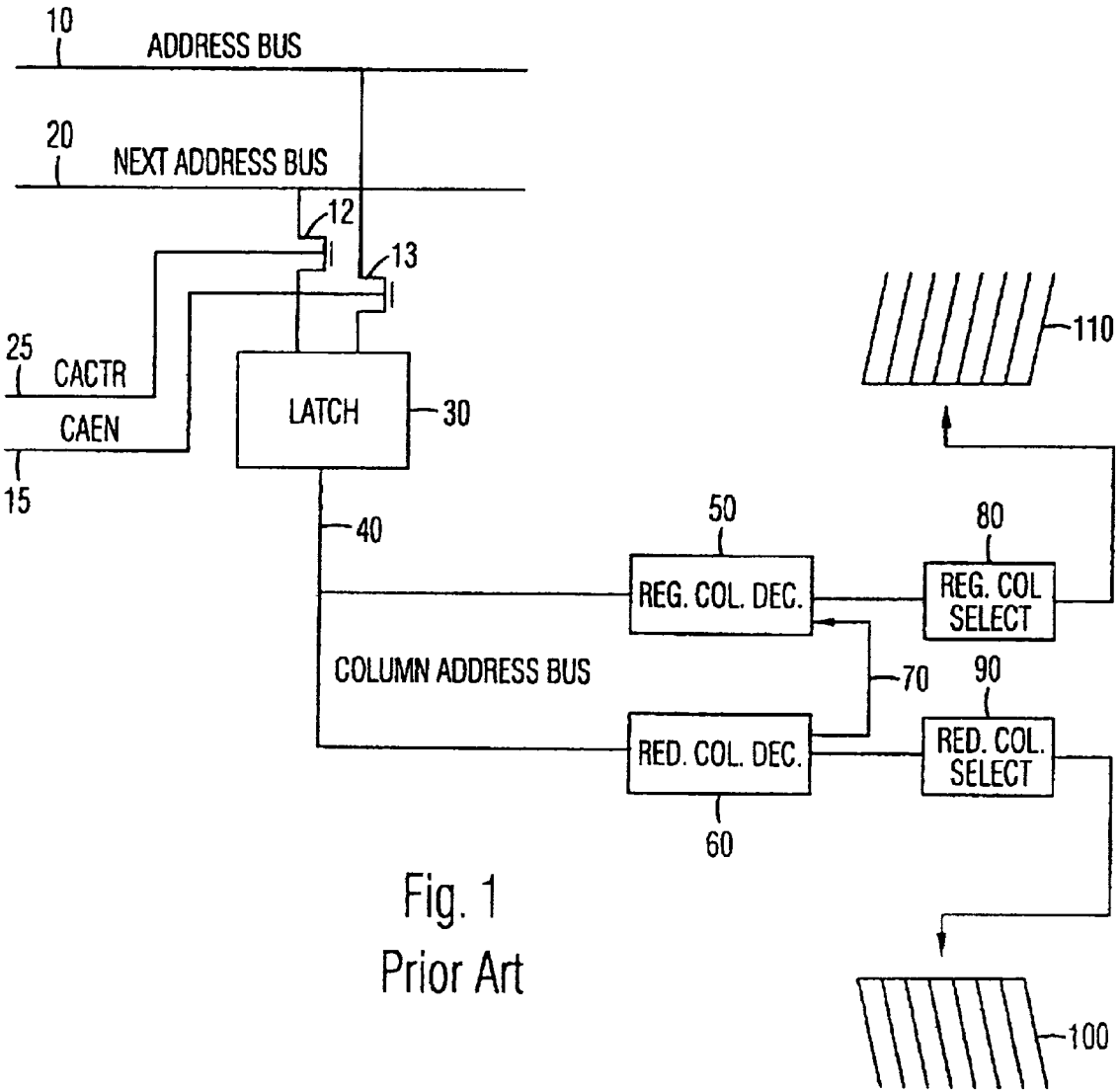
Fig. 1 Prior Art
FIG. 1 shows a block diagram of a conventional redundancy column accessing circuit.
Figure 2:
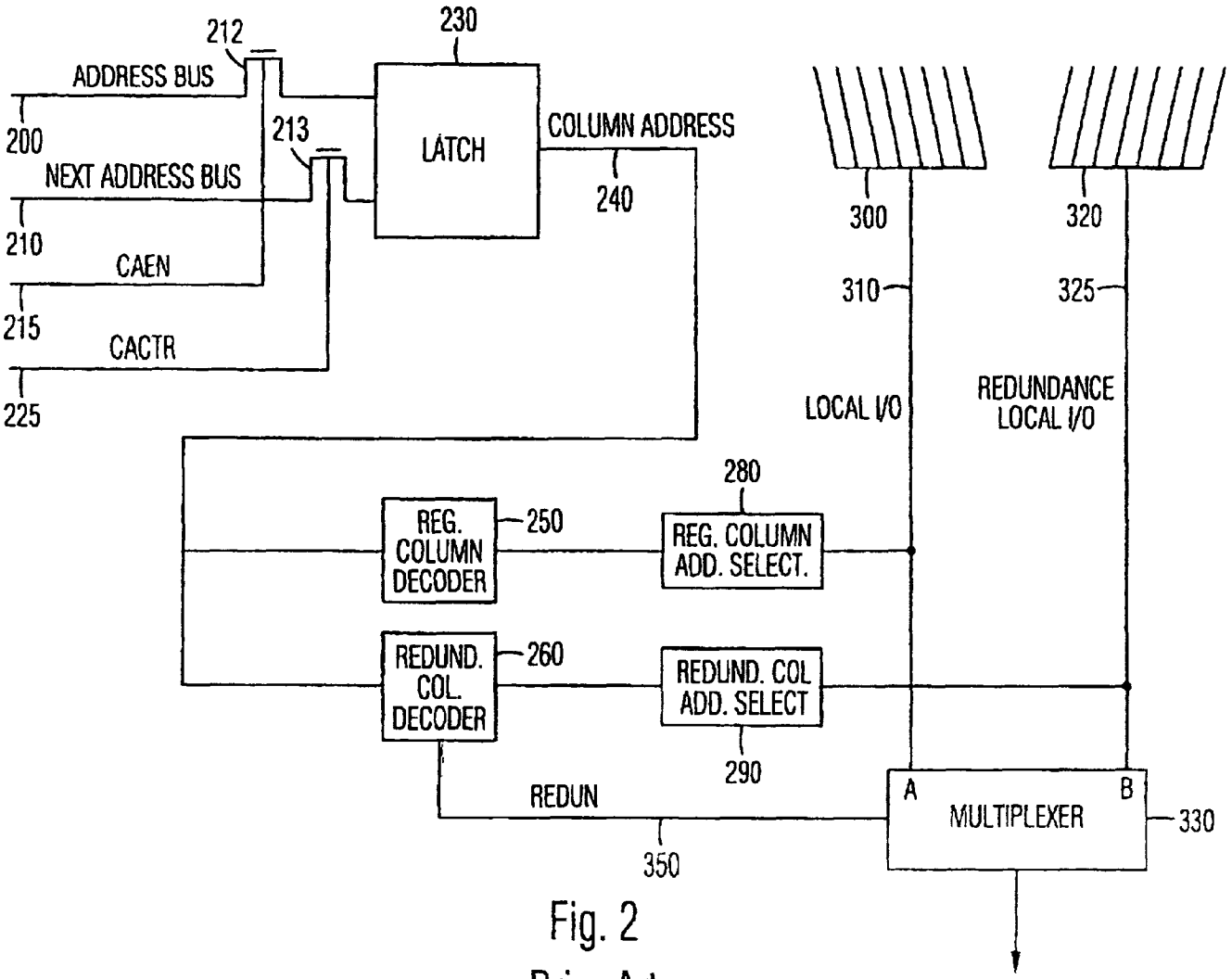
Fig. 2 Prior Art
FIG. 2 shows a block diagram of a prior art solution to timing delays in the conventional redundancy column accessing circuit.
Figure 3:
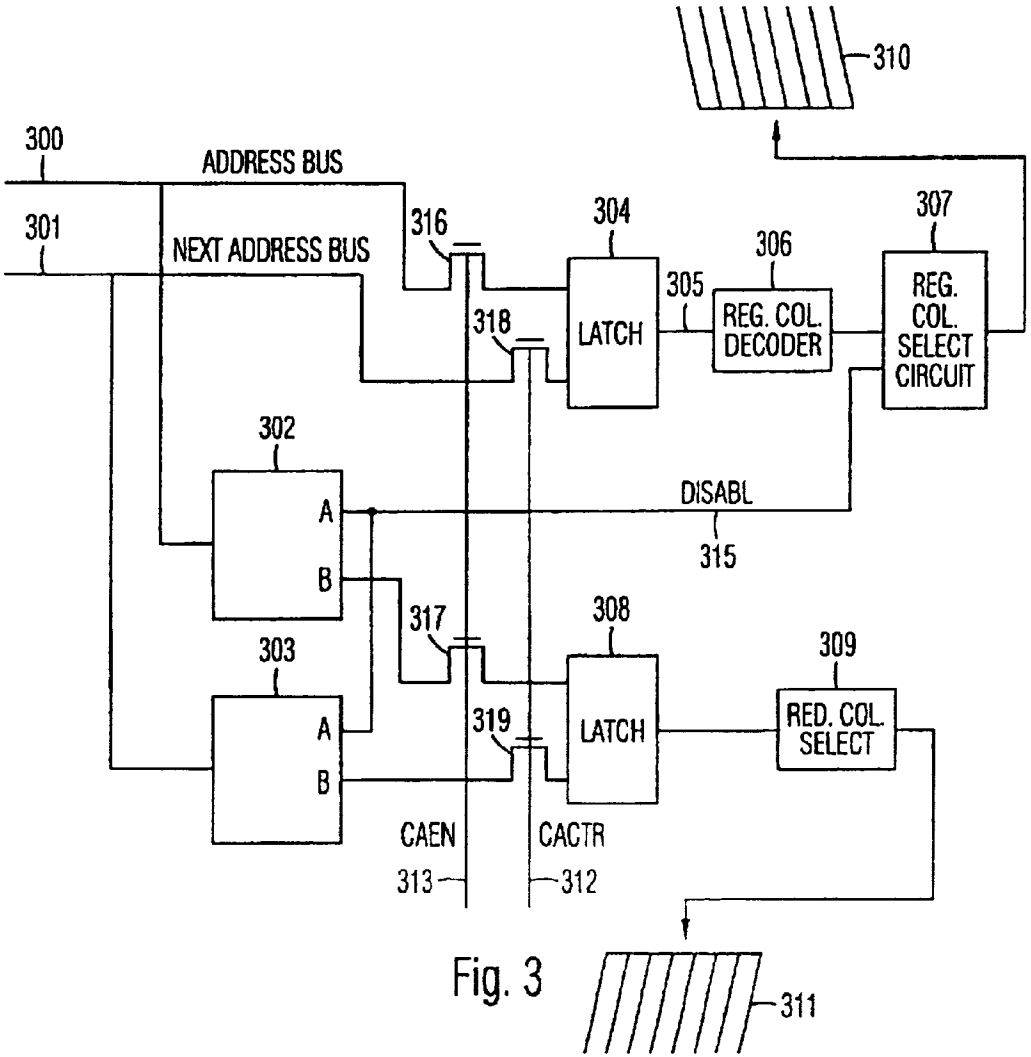
FIG. 3 shows a block diagram for the look-ahead column redundancy circuit of the present invention.

FIG. 3 shows a block diagram of the look ahead column redundancy access circuit of the preferred embodiment of the present invention. An address bus 300 and a next address bus 301 are used to transfer addressing information when accessing memory cells during memory access operations such as read and write operations. The address bus 300 is coupled to the source of a pass through transistor 316 and as an input to a redundancy column decoder 302. The next address bus 301 is coupled to the source of a pass through transistor 318 and as an input to a redundancy column decoder 303. A column address enable signal (CAEN) 313 is coupled to the gate of the transistor 316. A column address counter signal (CACTR) 312 is coupled to the gate of the transistor 318. A latch 304 is coupled to the drain of transistor 316 and the drain of transistor 318. The column address enable signal CAEN is enabled when operating in a normal transfer mode, and allows the information on the address bus 300 to pass through the transistor 316 to the latch 304. The column address counter signal CACTR is enabled when operating in a burst cycle mode, and allows the information on the next address bus 301 to pass through the transistor 318 to the latch 304.

The output of the latch 304 is coupled to a column address bus 305. The column address bus 305 is coupled to a regular column address decoder 306. The regular column address decoder 306 decodes the addressing information on the column address bus 305. The output of the regular column address decoder 306 is coupled to a regular column select circuit 307, which receives the decoded addressing information and instructs drivers to read or write data from the proper address in the normal memory array 310.

A first output A of each of the redundant column decoders 302 and 303 is coupled to the regular column select 307 through a disabling signal line (DISABL) 315. A second output B of the redundant address decoder 302 is coupled to the source of a pass through transistor 317. A second output B of the redundant address decoder 303 is coupled to the source of a pass through transistor 319. The column address enable signal CAEN 313 is coupled to the gate of the transistor 317 and the column address counter signal CACTR 312 is coupled to the gate of the transistor 319. A latch 308 is coupled to the drain of the transistor 317 and the drain of the transistor 319. The column address enable signal CAEN is enabled when operating in a normal transfer mode, and allows the decoded addressing information from the second output B of the redundant address decoder 302 to pass through the transistor 317 to the latch 308. The column address counter signal CACTR is enabled when operating in a burst cycle mode, and allows the decoded addressing information from the second output B of the redundant address decoder 303 to pass through the transistor 319 to the latch 308. The output of the latch 308 is coupled to a redundancy column select circuit 309. The latch 308 provides the decoded addressing information from the redundant address decoders 302 and 303 to the redundant column select circuit 309 for redundant memory access operations. The redundancy column select circuit 309 receives the decoded addressing information and instructs drivers to read or write data from the proper address in the redundancy column memory array 311. The redundant address decoders 302 and 303 raise the disabling signal DISABL 315 to a logical high voltage level when an address within the redundant memory array is detected. When raised to a logical high voltage level, the disabling signal DISABL 315 disables the regular column select circuit 307 and prevents the memory access operation from taking place within the main memory.

The address bus 300 is used to transfer addressing information when operating in a normal transfer mode. In a normal transfer mode, each subsequent address is generated and provided on the address bus 300. The next address bus 301 is used to transfer addressing information at the next address to be accessed when operating in the burst cycle mode. When operating in the burst cycle mode, the next address is normally generated independent of the CPU by incrementing a starting address during a burst cycle.

When executing a read or write operation, both the address bus 300 and the next address bus 301 are used to transfer the addressing information for accessing the appropriate memory block. This addressing information is decoded by the redundancy column decoders 302 and 303 which are configured in parallel.

The information from the address bus 300 and the next address 301 bus is then also selectively latched by the latch 304 onto the column address bus 305 depending on the state of the column address enable signal CAEN and the column address counter signal CACTR. The information from the address bus 300 is latched by the latch 304 onto the column address bus 305 during normal operating mode, while the information from the next address bus 301 is latched by the latch 304 onto the column address bus 305 when accessing the next address in a burst cycle mode.

The information on the address bus 300 is latched by the latch 304 when beginning at a new column address. The column address enable signal CAEN is activated to a logical high voltage level, enabling the information on the address bus 300 to pass through the transistor 316 and to be latched by the latch 304 onto the column address bus 305. When the column address enable signal CAEN is activated to a logical high voltage level, the decoded addressing information from the redundant address decoder 302 is also passed through the transistor 317 and latched by the latch 308.

The information on the next address bus 301 is latched by the latch 304 onto the column address bus 305 for the next address in a burst cycle mode. When the next address in a burst cycle is needed, the column address counter signal CACTR is raised to a logical high voltage level, enabling the next address information from the next address bus 301 to pass through the transistor 318 and to be latched by the latch 304 onto the column address bus 305. When the column address counter signal CACTR is raised to a logical high voltage level, the decoded addressing information from the redundant address decoder 303 is also passed through the transistor 319 and latched by the latch 308.

Once the appropriate addressing information is latched by the latch 304 onto the column address bus 305, it is provided to the regular column decoder 306. The regular column decoder 306 decodes the addressing information. The decoded addressing information is then forwarded to a regular column select circuit 307 indicating the column address where the memory access operation is to be completed. The regular column select circuit 307 instructs drivers to read or write the information from the appropriate address within the normal memory array 310.

However, if either of the redundancy column decoders 302 or 303 detect a column address within the redundancy column memory array, the appropriate redundancy column decoder 302 or 303 outputs a disabling signal (DISABL) on the signal line 315 to the regular column select circuit 307, thereby disabling the regular column pathway. Preferably, the disabling signal DISABL is active high such that a logical high voltage level disables the regular column select circuit 307 and the regular column pathway. In this way, the addressing information received by the regular column select circuit 307 from the regular column decoder 306 is disregarded and an access of the main memory is prevented.

The information on the address bus 300 is provided to the redundancy column decoder 302. The information on the next address bus 301 is provided to the redundancy column decoder 303. If either of the redundancy column decoders 302 or 303 detects an address within the redundancy memory array 311, the decoded redundancy address is output by the appropriate redundancy column decoder 302 or 303 and latched by the latch 308 to a redundancy column select circuit 309, when the appropriate control signal CAEN or CACTR is activated. The output from the redundancy column decoder 302 passes through the transistor 317 when the column address enable signal CAEN is at a logical high voltage level and the decoded addressing information is latched by the latch 308 and provided to the redundancy column select circuit 309. The output from the redundancy column decoder 303 passes through the transistor 319 when the column address counter signal CACTR is at a logical high voltage level and the information is latched by the latch 308 and provided to the redundancy column select circuit 309. Once the redundancy column select circuit 309 receives the decoded addressing information from the latch 308, the redundancy column select circuit 309 instructs memory drivers to retrieve from or write to the appropriate address within the redundancy column memory array 311.

If neither of the redundant column decoders 302 or 303 decodes an address within the redundancy column memory array 311, then the disabling signal DISABL is pulled to a logical low voltage level and the regular column pathway is not disabled. The disabling signal (DISABL) 315 is pulled to a logic low voltage level by the appropriate redundancy column decoder 302 or 303, if the current address to be accessed is not within the redundancy column memory array 311. If the disabling signal DISABL is pulled to a logical low voltage level, signalling that the current address to be accessed is not within the redundancy column memory array 311, then the regular column select circuit 307 does not disregard the addressing information received from the regular column decoder 306. Instead, the regular column select circuit 307 instructs memory drivers (not shown) to retrieve data from or write data to the appropriate address within the regular memory array 310 in order to complete the current memory access operation.

If either of the redundant column decoders 302 or 303 do decode an address within the redundancy column memory array 311, then the disabling signal DISABL is raised to a logical high voltage level and the regular column select circuit 307 is disabled. If the regular column select circuit 307 detects that the disabling signal DISABL has been raised to a logical high voltage level, then the regular column select circuit 307 disregards the decoded addressing information from the regular column decoder 306 and the main memory array 310 is not accessed. By providing the addressing information from the address bus 300 and the next address bus 301 to the redundant column decoders 302 and 303 before it is provided to the regular column decoder 306, the redundant column decoder 302 and 303 are able to decode the addressing information and determine if the addressing information corresponds to an address within the redundant memory array. If the addressing information does correspond to an address within the redundant memory array, then the main column pathway is disabled. If the addressing information does not correspond to an address within the redundant memory array, the main column pathway is not disabled and is also not delayed waiting for the disabling signal to become valid.

The look-ahead column redundancy circuit of the present invention reduces memory access delay times without a complicated design layout or significant board space to implement. The look ahead column redundancy circuit of the present invention allows the addressing information for a current memory access operation to be latched and processed in parallel without delays associated with waiting for the disabling signal.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention.

What is claimed is:

1. An apparatus for accessing a memory structure including a main memory array and a redundant memory array comprising:

a. an address bus for carrying addressing information for a current memory access operation;

b. a main column pathway including a main column decoder for decoding addressing information and a main select circuit for selecting appropriate groups of memory cells within the main memory array for the current memory access operation; and c. a redundant column pathway including a redundant column decoder for decoding addressing information having a first output for providing a decoded redundant address and a second output for providing a disable signal, and further including a redundant select circuit for selecting appropriate groups of memory cells within the redundant memory array for the current memory access operation if the first output of the redundant column decoder is providing the decoded redundant address and the second output is providing the disable signal, wherein the addressing information is decoded by the redundant column decoder before the addressing information is decoded by the main column decoder.

2. The apparatus as claimed in claim 1 wherein the second output of the redundant column decoder provides the disable signal to the main select circuit if the current memory access operation is accessing memory cells within the redundant memory array.

3. The apparatus as claimed in claim 1 wherein the redundant column decoder is provided the addressing information before the main column pathway.

4. The apparatus as claimed in claim 3 wherein the main column pathway is provided the addressing information and the redundant select circuit is provided the decoded redundant address from the redundant column decoder in response to a control signal.

5. The apparatus as claimed in claim 4 wherein the groups of memory cells are columns.

6. A method of completing memory access operations within a memory structure including a main memory array and a redundant memory array, comprising the steps of:

a. determining from addressing information for a current memory access operation if the addressing information represents an address included within the redundant memory array;

b. providing the addressing information for the current memory access operation to a main column pathway after the step of determining is completed;

c. decoding a main address within the main memory array corresponding to the addressing information;

d. activating a group of main memory cells within the main memory array corresponding to the main address; and e. providing a disable signal to a main column select circuit and a decoded redundant address to a redundant column pathway if the addressing information represents an address included within the redundant memory array and selecting the redundant column pathway.

7. The method as claimed in claim 6 further comprising the step of disabling the step of activating a group of main memory cells, if the addressing information represents an address included within the redundant memory array.

8. The method as claimed in claim 6 further comprising the step of activating a group of redundant memory cells within the redundant memory array, if the addressing information represents an address included within the redundant memory array.

9. The method as claimed in claim 8 wherein the step of providing the disable signal is completed before the step of providing the addressing information.

10. The method as claimed in claim 6 wherein the groups of main memory cells are columns within the main memory array.

11. The method as claimed in claim 8 wherein the groups of redundant memory cells are columns within the redundant memory array.

12. An apparatus for controlling access to a memory structure including a regular memory array and a redundancy memory array comprising:

a. an address bus for carrying addressing information for a current memory access operation;

b. a first redundancy column decoder coupled to the address bus for decoding the addressing information, the first redundancy column decoder including a first output for providing a first decoded redundancy address and a second output for providing a disable signal;

c. a first pass through circuit coupled to the address bus for passing through the addressing information in response to a first control signal;

d. a first latching circuit coupled to the first pass through circuit for latching the addressing information which has passed through the first pass through circuit;

e. a regular column decoder circuit coupled to the first latching circuit for decoding the addressing information and providing a decoded regular address;

f. a second pass through circuit coupled to the first output of the first redundancy column decoder for passing through the first decoded redundancy address in response to the first control signal;

g. a second latching circuit coupled to the second pass through circuit for latching the first decoded redundancy address from the first output of the first redundancy column decoder which has passed through the second pass through circuit;

h. a regular column select circuit coupled to the regular column decoder to receive the decoded regular address and to select a corresponding regular column address within the regular memory array, wherein the regular column select circuit is also coupled to receive the disable signal from the second output of the first redundancy column decoder for disabling the regular column select circuit if the addressing information corresponds to an address within the redundancy memory array; and i. a redundancy column select circuit coupled to the second latching circuit to receive the first decoded redundancy address and to select a corresponding redundant column address within the redundancy memory array, if the addressing information corresponds to an address within the redundancy memory array.

13. The apparatus as claimed in claim 12 wherein the first redundancy column decoder is provided the addressing information before the first latching circuit.

14. The apparatus as claimed in claim 13 wherein the first control signal is a column address enable signal.

15. The apparatus as claimed in claim 12 further comprising:

a. a next address bus for carrying next addressing information for a next memory access operation;

b. a second redundancy column decoder coupled to the next address bus for decoding the next addressing information, the second redundancy column decoder including a third output for providing a second decoded redundancy address and a fourth output for providing the disable signal;

c. a third pass through circuit coupled to the next address bus for passing through the next addressing information in response to a second control signal, wherein the third pass through circuit is also coupled to pass the next addressing information through to the first latching circuit; and d. a fourth pass through circuit coupled to the third output of the second redundancy column decoder for passing through the second decoded redundancy address in response to the second control signal, wherein the fourth pass through circuit is also coupled to pass the second decoded redundancy address through to the second latching circuit.

16. The apparatus as claimed in claim 15 wherein the first and second column decoders are provided the addressing information and the next addressing information before the first latching circuit.

17. The apparatus as claimed in claim 16 wherein the second control signal is a column address counter signal.

*18. A memory subsystem comprising:*

*an address bus;*

*a main column pathway configured to receive an address from the address bus and further configured to be coupled to a main memory array, wherein the main column pathway includes at least a first storage element and a first decoder; and*

*a redundant column pathway configured to receive the address from the address bus and further configured to be coupled to a redundant memory array, wherein the redundant column pathway includes at least a second storage element and a second decoder;*

*wherein in the main column pathway, the first storage element is configured to store the address prior to the address being decoded by the first decoder, and in the redundant column pathway, the second decoder is configured to decode the address prior to an output of the second decoder being stored within the second storage element.*

*19. The memory subsystem as recited in claim 18, wherein the second decoder is configured to assert a disable signal if a current memory access operation is accessing memory cells within the redundant memory array, and wherein the main column pathway further includes a first select circuit coupled to receive the disable signal, wherein the first select circuit is configured to be disabled responsive to receiving the disable signal.*

*20. The memory subsystem as recited in claim 19, wherein the first select circuit is coupled to receive an output from the first decoder, and wherein the redundant column pathway further includes a second select circuit coupled to receive an output from the second storage element.*

*21. The memory subsystem as recited in claim 20, wherein the first select circuit is coupled to provide access to the main memory array, and wherein the second select circuit is coupled to provide access to the redundant memory array.*

*22. The memory subsystem as recited in claim 19, wherein the second decoder is configured to not assert the disable signal if the current memory access operation is accessing memory cells within the main memory array.*

*23. The memory subsystem as recited in claim 19, wherein the memory subsystem further comprises a next address bus coupled to provide the address to the first storage element and further coupled to provide address signals to a third decoder, wherein the third decoder is in the redundant column pathway, and wherein the next address bus is configured to convey the address during a burst cycle mode.*

*24. The memory subsystem as recited in claim 23, wherein the third decoder is configured to assert the disable signal if the address received from the next address bus indicates that the current memory access operation is accessing cells in the redundant memory array.*

*25. The memory subsystem as recited in claim 18, wherein each of the first and second storage elements is a latch.*

*26. A system comprising:*

*a main memory array;*

*a redundant memory array;*

*an address bus;*

*a first storage element;*

*a main memory decoder configured to decode an address stored in the first storage element;*

*a redundant memory decoder configured to decode an address sent on the address bus and configured to generate an indication of whether the sent address is associated with any memory cells in the redundant memory array;*

*a second storage element coupled to store an output of the redundant memory decoder; and*

*selection circuitry configured to selectively cause either the main memory array or the redundant memory array to be accessed depending on the indication.*

*27. The system as recited in claim 26, wherein the selection circuitry includes a main memory select circuit coupled to provide access to the main memory array and a redundant memory select circuit coupled to provide access to the redundant memory array, wherein the main memory select circuit is coupled to receive the indication.*

*28. The system as recited in claim 27, wherein the main memory select circuit is coupled to receive an output from the main memory decoder, and wherein the redundant memory select circuit is coupled to receive an output from the second storage element.*

*29. The system as recited in claim 27, wherein the main memory select circuit is configured to be disabled responsive to receiving the indication.*

*30. The system as recited in claim 27, wherein the redundant memory decoder is configured to not assert the indication if the address is associated with memory cells in the main memory array.*

*31. The system as recited in claim 27 further comprising:*

*a next address bus configured to convey a next address, wherein the first storage element is configured to store the address conveyed on the next address bus; and*

*a next address decoder configured to decode the next address conveyed on the next address bus and configured to generate an indication if the next address is associated with memory cells in the redundant memory array;*

*wherein the selection circuitry configured to selectively cause either the main memory array or the redundant memory array to be accessed depending on a state of the indication.*

*32. The system as recited in claim 31, wherein the main memory select circuit is coupled to receive the indication from the next address decoder, and wherein the main memory select circuit is configured to be disabled responsive to receiving the indication.*

*33. The system as recited in claim 31, wherein the next address decoder is configured to not assert the indication if the next address is associated with memory cells in the main memory array.*

*34. The system as recited in claim 31, wherein the second storage element is configured to store an output of the next address decoder.*

*35. The system as recited in claim 31, wherein the next address is associated with a burst cycle mode.*

*36. The system as recited in claim 26, wherein each of the first and second storage elements is a latch.*

*37. An apparatus configured to receive addressing information corresponding to a memory access, comprising:*

*a main memory control pathway configured to receive said addressing information, wherein said main memory control pathway includes a main decoder configured to decode said addressing information, producing decoded addressing information usable to select a group of memory locations in a main memory array;*

*a redundant memory control pathway configured to receive said addressing information, wherein said redundant memory control pathway includes a redundant decoder;*

*wherein, if said addressing information corresponds to a group of memory locations in a redundant memory array, said redundant decoder is configured to provide via a first output, decoded addressing information usable to select said group of memory locations in said redundant memory array, and, via a second output, an activated disable signal;*

*wherein said redundant decoder is configured to decode said addressing information before said main decoder.*

*38. The apparatus of claim 37, wherein said main memory control pathway and said redundant memory control pathway and configured to select columns in said main memory array and redundant memory array respectively.*

*39. The apparatus of claim 37, wherein said redundant decoder is configured to provide said activated disable sig-*

*nal to said main memory control pathway, disabling said main memory control pathway from selecting said group of memory locations in said main memory array.*

*40. The apparatus of claim 37, wherein addressing information is provided to said redundant decoder before being provided to said main memory control pathway.*

*41. The apparatus of claim 37, wherein the apparatus is an electronics system including random access memory.*

*42. The apparatus of claim 37, wherein the apparatus is configured to operate in burst mode.*

*43. The apparatus of claim 37, wherein, if said addressing information does not correspond to a group of memory locations in said redundant memory array, said main memory control pathway is configured to select a group of memory locations in said main memory array.*

*44. An apparatus, comprising:*

*a first memory control unit configured to receive a memory address, generate first control information usable to select a group of locations within a main memory array, and convey said first control information to said main memory array;*

*a second memory control unit configured to receive said memory address;*

*wherein, if said memory address corresponds to a group of locations in a redundant memory array, said second memory control unit is configured to:*

*generate second control information usable to select said group of locations within said redundant memory array; and*

*disable said first memory control unit from conveying said first control information to said main memory array.*

*45. The apparatus of claim 44, wherein the apparatus is an electronics system including random access memory.*

*46. The apparatus of claim 44, wherein first control information is usable to select one or more columns with said main memory array, and wherein said second control information is usable to select one or more columns within said redundant memory array.*

*47. The apparatus of claim 44, wherein said apparatus is configured to operate in burst mode.*

*48. The apparatus of claim 44, wherein if said memory address does not correspond to a group of locations in said redundant memory array, said first memory control unit is configured to select said group of locations within said main memory array specified by said conveyed first control information.*

*49. An apparatus, comprising:*

*a main address pathway configured to receive a memory address, generate first address selection information, and convey said first address selection information to a main memory array,*

*a redundant address pathway configured to receive said memory address, wherein said redundant address pathway, in response to determining that a group of locations corresponding to said memory address is stored in a redundant memory array, is configured to:*

*generate second address selection information and convey said second address selection information to said redundant memory array; and*

*send an indication to said main address pathway that a group of locations corresponding to said memory address is stored in said redundant memory array;*

*wherein said indication is received by said main address pathway before said main address pathway conveys said first address selection information to said main memory array.*

*50. The apparatus of claim 49, wherein said apparatus is an electronics system including random access memory.*

*51. The apparatus of claim 49, wherein said apparatus is configured to operate in burst mode.*

*52. The apparatus of claim 49, wherein said indication is an activated disable signal, and wherein said main address pathway is configured such that receiving said activated disable signal prevents said main address pathway from conveying said first address selection information to said main memory array.*

*53. An apparatus, comprising:*

*first means for receiving a memory address and generating, in response thereto, information usable to select a group of memory cells in a first memory array;*

*second means for receiving said memory address; for determining whether said memory address corresponds to one or more locations in a second memory array; and, if so,*

*for generating information usable to select a group of memory cells in said second memory array and activating a disable signal;*

*wherein said second means is configured to determine whether said memory address corresponds to said one or more locations in said second memory array before said first means generates said information usable to select said group of memory cells in said first memory array.*

*54. The apparatus of claim 53, wherein said apparatus is an electronics system including random access memory.*

*55. The apparatus of claim 53, wherein said first means, in response to receiving said activated disable signal, is configured to disable selection of said group of memory cells in said first memory array.*

*56. A method, comprising:*

*determining, in a redundant memory control pathway, whether addressing information for a current memory access corresponds to one or more locations within a redundant memory array;*

*after said determining:*

*providing said addressing information to a main memory control pathway; and*

*decoding said addressing information provided to said main memory control pathway; and*

*if said addressing information corresponds to one or more locations within said redundant memory array:*

*providing a disable signal to said main memory control pathway; and*

*selecting said one or more locations within said redundant memory array corresponding to said addressing information.*

*57. The method of claim 56, further comprising said main memory control pathway operating in burst mode.*

*58. A method, comprising:*

*decoding a memory address in a first memory control unit;*

*determining, in a second memory control unit, whether said memory address corresponds to one or more locations in a redundant memory array, and, if so:*

*generating address control information usable to select said one or more locations in said redundant memory array; and*

*providing a disable signal to said first memory control unit;*

*wherein said determining by said second memory control unit is performed before said decoding by said first memory control unit.*

*59. The method of claim 58, wherein said determining is performed by decoding said memory address within said second memory control unit.*

*60. The method of claim 58, wherein said providing said disable signal to said first memory control unit disables said first memory control unit from selecting one or more locations in a main memory array.*

*61. The method of claim 58, further comprising said first memory control unit operating in burst mode.*

*62. The method of claim 61, further comprising said second memory control unit operating in burst mode.*

*63. A method, comprising:*

*providing a memory address to a first memory control unit and a second memory control unit corresponding to a first memory array and a second memory array, respectively;*

*determining, in said second memory control unit, whether said memory address corresponds to one or more locations in said second memory array, and, if so:*

*generating address control information usable to select said one or more locations within said second memory array; and*

*providing a disable signal to a first memory control unit prior to said first memory control unit generating address control information usable to select one or more locations within said first memory array.*

*64. A method of completing memory access operations within a memory structure including a main memory array and a redundant memory array, comprising:*

*determining from addressing information for a current memory access operation if the addressing information represents an address included within the redundant memory array;*

*providing the addressing information for the current memory access operation to a main column pathway after the step of determining is completed;*

*decoding a main address within said main memory array corresponding to the addressing information;*

*if the addressing information represents an address included within the redundant memory array:*

*providing a disable signal to a main column select circuit and providing a decoded redundant address to a redundant column pathway; and*

*selecting the redundant column pathway.*

*65. The method of claim 64, further comprising activating a group of cells in said main memory array if said addressing information does not represent an address included within the redundant array.*

* * * * *